(12) United States Patent
Allegoren (10) Patent No.: US 11,647,617 B2
(45) Date of Patent: *May 9, 2023

(54) ENCLOSURES AND CORRESPONDING MAGNETIC JOINTS

(71) Applicant: ILLUMINA, INC., San Diego, CA (US)

(72) Inventor: Erik Allegoren, San Diego, CA (US)

(73) Assignee: ILLUMINA, INC., San Diego, CA (US)

(*) Notice: Subject to any disclaimer, the term of this patent is extended or adjusted under 35 U.S.C. 154(b) by 94 days.

This patent is subject to a terminal disclaimer.

(21) Appl. No.: 17/463,947

(22) Filed: Sep. 1, 2021

(65) Prior Publication Data

US 2021/0400854 A1 Dec. 23, 2021

Related U.S. Application Data

(63) Continuation of application No. 17/010,664, filed on Sep. 2, 2020, now Pat. No. 11,160,199.

(60) Provisional application No. 62/895,878, filed on Sep. 4, 2019.

(30) Foreign Application Priority Data

Nov. 28, 2019 (NL) .................................... 2024325

(51) Int. Cl.
*H05K 9/00* (2006.01)
*B01L 1/00* (2006.01)
*H01F 7/02* (2006.01)
*E04F 13/08* (2006.01)

(52) U.S. Cl.
CPC .............. *H05K 9/0075* (2013.01); *B01L 1/00* (2013.01); *H01F 7/02* (2013.01); *B01L 2300/041* (2013.01); *B01L 2300/046* (2013.01); *E04F 13/0883* (2013.01)

(58) Field of Classification Search
None
See application file for complete search history.

(56) References Cited

U.S. PATENT DOCUMENTS

| | | |
|---|---|---|
| 4,768,748 A | 9/1988 | Leimkuhler et al. |
| 7,843,296 B2 | 11/2010 | Fullerton et al. |
| 2004/0213374 A1 | 10/2004 | Kang et al. |
| 2018/0305924 A1 | 10/2018 | Buffington et al. |
| 2021/0068319 A1 | 3/2021 | Allegoren |

FOREIGN PATENT DOCUMENTS

| | | |
|---|---|---|
| CN | 201894417 U | 7/2011 |
| WO | WO-2012/017629 A1 | 2/2012 |
| WO | WO-2015/054292 A1 | 4/2015 |

*Primary Examiner* — P. Kathryn Wright
(74) *Attorney, Agent, or Firm* — Marshall, Gerstein & Borun LLP (57) ABSTRACT

Enclosures and corresponding magnetic joints. An apparatus includes an enclosure. The enclosure includes a magnetic panel joint formed by: a first panel carrying a magnet and comprising a first pocket; a second panel including a second pocket; and a ferromagnetic shield coupled within the second pocket and couplable within the first pocket via the magnet.

23 Claims, 8 Drawing Sheets

ENCLOSURES AND CORRESPONDING MAGNETIC JOINTS

RELATED APPLICATION

This application is a continuation of U.S. patent application Ser. No. 17/010,664, filed Sep. 2, 2020, which claims the benefit of and priority to U.S. Provisional Patent Application No. 62/895,878, filed Sep. 4, 2019, and Dutch Patent Application 2024325 filed on Nov. 28, 2019, the content of each of which is incorporated by reference herein in its entirety and for all purposes.

BACKGROUND

Sequencing platforms may include an enclosure. In instances when the sequencing platform includes lasers, the enclosure may be a light-tight enclosure.

SUMMARY

In accordance with a first example, a method includes or comprises forming a pocket and a receptacle in an end portion of a first panel. The pocket includes or comprises an end opening and is contiguous with the receptacle. The method includes or comprises coupling a magnet within the receptacle and forming a pocket within a second panel that terminates at an end face of the second panel. The method includes or comprises coupling a first shield portion of a ferromagnetic shield in the pocket of the second panel such that a second shield portion of the ferromagnetic shield extends from the end face of the second panel. An inner shield surface of the ferromagnetic shield is substantially flush with an inner second panel surface of the second panel. The method includes or comprises disposing the second shield portion of the ferromagnetic shield within the pocket of the first panel via the end opening to form a magnetic lap joint. The inner shield surface and the inner second panel surface are substantially flush with an inner first panel surface of the first panel.

In accordance with a second example, an apparatus includes or comprises a first panel having an end portion defining a pocket and a receptacle. The pocket includes or comprises an end opening and is contiguous with the receptacle. The apparatus includes or comprises a magnet disposed within the receptacle and is coupled therein. The apparatus includes or comprises a second panel having an end portion including or comprising an end face and defining a pocket terminating at the end face. The apparatus includes or comprises a ferromagnetic shield having a first shield portion and a second shield portion. The first shield portion is disposed within the pocket of the second panel and coupled therein. The second shield portion extends from the end face of the second panel. An inner shield surface of the ferromagnetic shield is substantially flush with an inner second panel surface of the second panel. The second shield portion of the ferromagnetic shield is receivable within the pocket of the first panel via the end opening to form a magnetic lap joint. The inner shield surface and the inner second panel surface are substantially flush with an inner first panel surface of the first panel.

In accordance with a third example, an apparatus includes or comprises an enclosure. The enclosure includes or comprises a magnetic panel joint formed by: a first panel carrying a magnet and including or comprising a first pocket; a second panel including or comprising a second pocket; and a ferromagnetic shield coupled within the second pocket and couplable within the first pocket via the magnet.

In further accordance with the foregoing first, second, and/or third examples, an apparatus and/or method may further include or comprise any one or more of the following:

In an example, forming the receptacle includes or comprises forming a plurality of receptacles in the end portion of the first panel and coupling the magnet within the receptacle includes or comprises coupling a magnet in each of the plurality of receptacles.

In another example, further including or comprising forming a pair of dowel bores at the end face of the second panel, coupling a dowel within each of the dowel bores, and forming a master dowel bore and a slave dowel bore in an end face of the first panel. The master dowel bore and the slave dowel bore being adapted to each receive a respective one of the dowels.

In another example, further including or comprising a dowel joint formed between the first panel and the second panel when the magnetic lap joint is formed between the first panel and the second panel.

In another example, the dowel joint includes or comprises a pair of dowels, a master dowel bore, and a slave dowel bore.

In another example, the dowels extend from the second panel on either side of the pocket of the second panel, the master dowel bore is defined on one side of the pocket of the first panel, and the slave dowel bore is defined on another side of the pocket of the first panel.

In another example, the first panel defines a plurality of receptacles including or comprising the receptacle, each of the plurality of receptacles includes or comprises a corresponding magnet disposed therein.

In another example, the receptacles are positioned in a staggered arrangement.

In another example, the pocket of the first panel and the pocket of the second panel are similar to one another.

In another example, the enclosure substantially restricts ingress and egress of light through the enclosure.

In another example, the magnetic panel joint substantially restricts ingress and egress of light through the magnetic panel joint.

In another example, an inward facing ferromagnetic shield surface of the ferromagnetic shield is substantially flush with an inward facing second panel surface of the second panel.

In another example, an inward facing first panel surface is substantially flush with the inward facing ferromagnetic shield surface when the ferromagnetic shield is coupled within the first pocket via the magnet.

In another example, further including or comprising an alignment dowel bore defined by one of the first panel or the second panel and a corresponding alignment dowel carried by the other one of the first panel or the second panel.

In another example, the first panel defines a receptacle receiving the magnet, the alignment dowel bore is defined by the first panel and is coplanar with the receptacle, and the alignment dowel includes or comprises a ferromagnetic material.

In another example, the alignment dowel bore includes or comprises a master dowel bore. Further including or comprising a slave dowel bore defined by the first panel or the second panel and a corresponding alignment dowel carried by the other of the first panel or the second panel.

In another example, the first panel and the second panel include or comprise end faces. One of the end faces carries a face magnet and the other of the end faces carries a corresponding face ferromagnetic segment.

In another example, exterior surfaces of the first panel and the second panel are substantially flush or otherwise visually contiguous.

It should be appreciated that all combinations of the foregoing concepts and additional concepts discussed in greater detail below (provided such concepts are not mutually inconsistent) are contemplated as being part of the inventive subject matter disclosed herein and/or may be combined to achieve the particular benefits of a particular aspect. In particular, all combinations of claimed subject matter appearing at the end of this disclosure are contemplated as being part of the inventive subject matter disclosed herein.

DETAILED DESCRIPTION

Although the following text discloses a detailed description of example methods, apparatus, and/or articles of manufacture, it should be understood that the legal scope of the property right is defined by the words of the claims set forth at the end of this patent. Accordingly, the following detailed description is to be construed as examples only and does not describe every possible example, as describing every possible example would be impractical, if not impossible. Numerous alternative examples could be implemented, using either current technology or technology developed after the filing date of this patent. It is envisioned that such alternative examples would still fall within the scope of the claims.

The examples disclosed herein relate to enclosures for sequencing platforms, array platforms, etc. The enclosures include panel joints that are secure, substantially light-tight, shielded, serviceable, and/or cosmetically un-intrusive. While the present examples are described relative to certain applications, the panel joints described herein can be implemented in any type of enclosure (e.g., a vehicle panel, an appliance panel, etc.). Moreover, the panel joints described herein are not limited to implementation in enclosures, but can be utilized for any low-profile joint. For example, the enclosures and/or the associated couplings may be used in any light-tight, no-tools joints.

The panel joints may be formed using a magnet and a shielding plate. The magnet may be carried by a first panel and the shielding plate may be carried by and extend from a second panel in a manner that allows the shielding plate to also be receivable by the first panel. To allow the panels to carry the magnet and to receive the shielding plate, the panels may define pockets and/or one or more receptacles. As a result, when the shielding plate is received within the pockets of the panels to form the panel joint, the panel joint may be formed within the nominal thickness of the panels and without consuming significant real estate of the enclosure and/or space defined therein.

Figure 1:
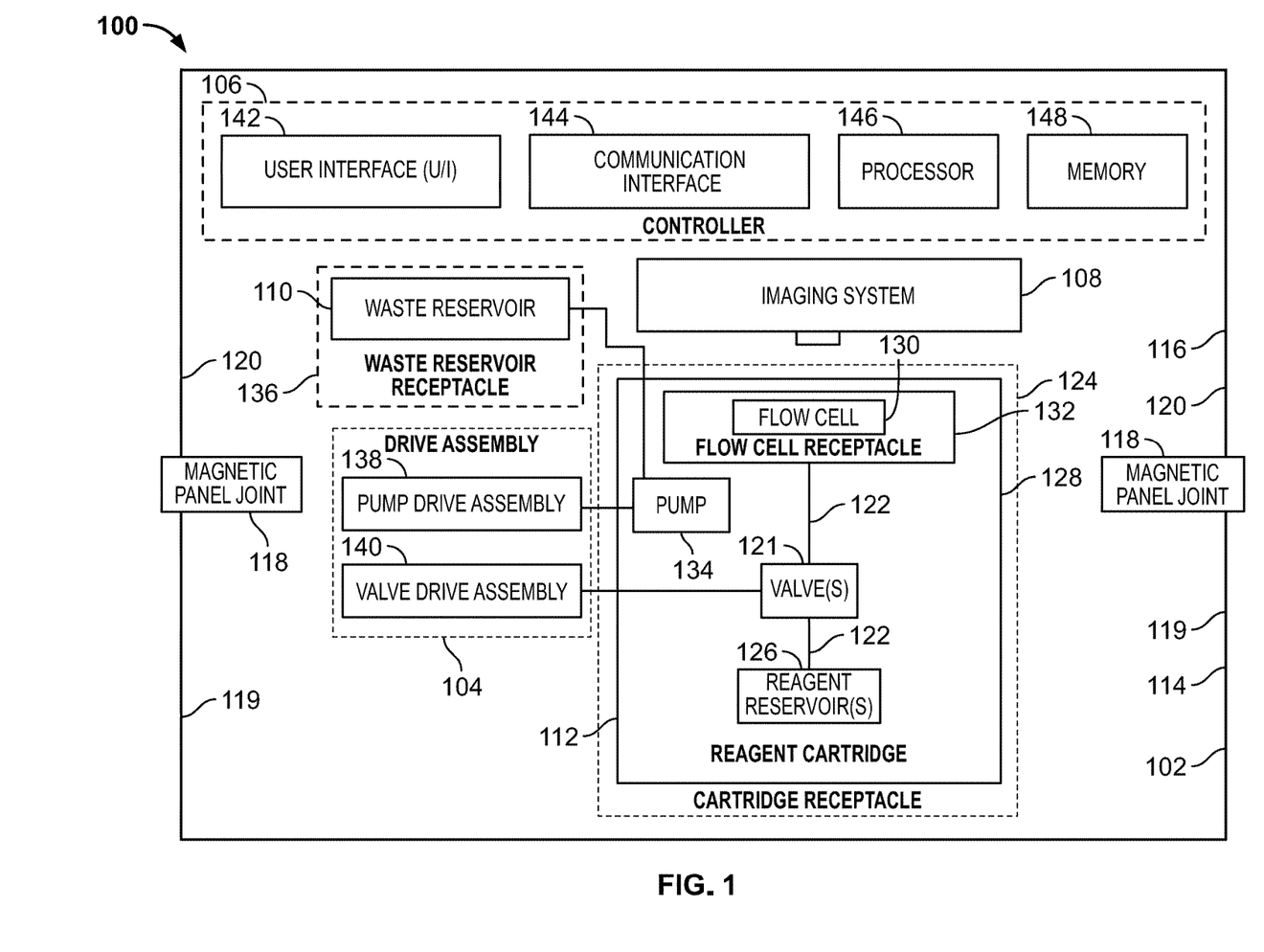
FIG. 1 illustrates a schematic diagram of an example system in accordance with the teachings of this disclosure.

FIG. 1 illustrates a schematic diagram of an example system 100 in accordance with the teachings of this disclosure. The system 100 can be used to perform an analysis on one or more samples of interest. The sample may include one or more DNA clusters that have been linearized to form a single stranded DNA (sstDNA). Thus, the system 100 may be a sequencing platform. In the example shown, the system 100 includes, in part, an enclosure 102, a drive assembly 104, a controller 106, an imaging system 108, and a waste reservoir 110. The system 100 is adapted to receive a reagent cartridge 112. In some implementations, the waste reservoir 110 may not be in the system 100 and may instead be part of the reagent cartridge 112. The controller 106 is electrically and/or communicatively coupled to the drive assembly 104 and to the imaging system 108 and is adapted to cause the drive assembly 104 and/or the imaging system 108 to perform various functions as disclosed herein.

Figure 2:
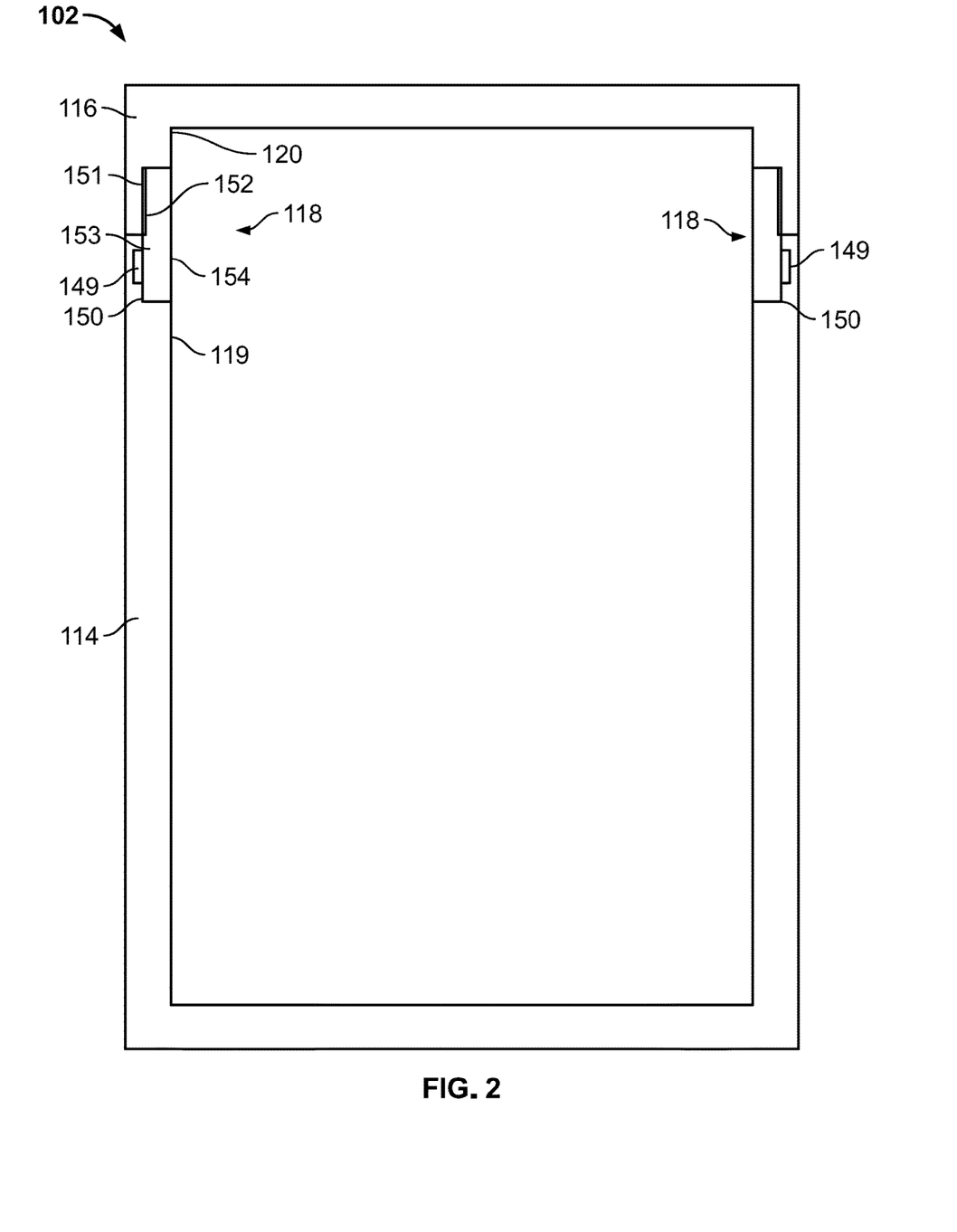
FIG. 2 is a cross-sectional top view of an example of an enclosure of the system of FIG. 1.

The enclosure 102 may be adapted to shield against dust, light, and/or electromagnetic emissions and, in the example shown, includes a first panel 114 and a second panel 116 that are coupled by magnetic panel joints 118 (an example of the magnetic panel joint 118 is more clearly shown in FIG. 2). The first panel 114 may be referred to as a front enclosure panel and the second panel 116 may be referred to as a rear enclosure panel. The magnetic panel joints 118 may also be referred to as magnetic lap joints.

The magnetic panel joints 118 may be adapted to allow an inward facing first panel surface 119 of the first panel 114 to be substantially flush or otherwise visually contiguous with an inward facing second panel surface 120 of the second panel 116. As set forth herein, the phrase "substantially flush" means that the surfaces 119, 120 are within +/−5% of their thickness with one another including being exactly coplanar. Thus, the magnetic panel joints 118 may be referred to as zero thickness joints. The inward facing first panel surface 119 may be referred to as an exterior surface of the first panel 114 and the inward facing second panel surface 120 may be referred to as an exterior surface of the second panel 116. Moreover, in some examples, the magnetic panel joints 118 may form a coupling that deters lasers and/or light from passing therethrough. Put another way, the enclosure 112 and/or the magnetic panel joint 118 may substantially restrict the ingress and egress of light. Thus, the magnetic panel joints 118 may prove suitable in preventing or otherwise deterring laser/light emissions from the system 100 and/or may deter against radiative emissions from the system 100 and/or through magnetic panel joint 118. The magnetic panel joints 118 will be further described below.

Referring now to the reagent cartridge 112, in the example shown, the reagent cartridge 112 can carry the sample of interest to be flowed onto a flow cell 130 and/or the sample can be provided via another mechanism to the flow cell 130. The drive assembly 104 interfaces with the reagent cartridge 112 to flow one or more reagents that interact with the sample at the flow cell 130 through the reagent cartridge 112.

In an example, a reversible terminator with an identifiable label can be attached to a detection nucleotide to allow a single nucleotide to be incorporated by the sstDNA per cycle. In some such examples, one or more of the nucleotides has a unique fluorescent label that emits a color when excited. The color (or absence thereof) is used to detect the corresponding nucleotide. In the example shown, the imaging system 108 can be adapted to excite one or more of the identifiable labels (e.g., a fluorescent label) and thereafter obtain image data for the identifiable labels. The labels may be excited by incident light and/or a laser and the image data may include one or more colors emitted by the respective labels in response to the excitation. The image data (e.g., detection data) may be analyzed by the system 100. The imaging system 108 may be a fluorescence spectrophotometer including an objective lens and/or a solid-state imaging device. The solid-state imaging device may include a charge coupled device (CCD) and/or a complementary metal oxide semiconductor (CMOS).

After the image data is obtained, the drive assembly 104 interfaces with the reagent cartridge 112 to flow another reaction component (e.g., a reagent) through the flow cell 130 that is thereafter received by the waste reservoir 110, which can be located in the system 100 and/or in the reagent cartridge 112 itself, and/or otherwise exhausted by the reagent cartridge 112. Some reaction components perform a flushing operation that chemically cleaves the fluorescent label and the reversible terminator from the sstDNA. The sstDNA is then ready for another cycle.

Referring to the example shown, the reagent cartridge 112 is receivable within a cartridge receptacle 124 of the system 100 and may include reagent reservoirs 126, a body 128, one or more valves 121, and/or fluidic lines 122. The reagent reservoirs 126 may contain fluid (e.g., reagent and/or another reaction component) and the valves 121 may be selectively actuatable to control the flow of fluid through the fluidic lines 122. One or more of the valves 121 may be implemented by a rotary valve, a pinch valve, a flat valve, a solenoid valve, a check valve, a piezo valve, etc. The body 128 may be formed of solid plastic using injection molding techniques and/or additive manufacturing techniques. In some examples, the reagent reservoirs 126 are integrally formed with the body 128. In other examples, the reagent reservoirs 126 are separately formed and coupled to the body 128. In another example, the reagent cartridge 112 may not be included and the one or more valves 129 and other associated components may be integral to the system 100. In such an example, the reagent reservoirs 126 may be fluidly coupled to the one or more valves 121 via, for example, fluidic lines.

The reagent cartridge 112 is in fluid communication with a flow cell 130. In the example shown, the flow cell 130 is carried by the reagent cartridge 112 and is received via a flow cell receptacle 132. Alternatively, the flow cell 130 can be integrated into the reagent cartridge 112. In such examples, the flow cell receptacle 123 may not be included or, at least, the flow cell 130 may not be removably receivable within the reagent cartridge 112. As a further alternative, the flow cell 130 may be separate from the reagent cartridge 112, such as insertable into the system 100 separately or integrated into the system 100.

To draw reagent through the flow cell 130, the reagent cartridge 112 may include a pump 134 in fluid communication with the flow cell 130 and the waste reservoir 110. The waste reservoir 110 may be selectively receivable within a waste reservoir receptacle 136 of the system 100 and/or may be a part of the reagent cartridge 112. The pump 134 may be implemented by a syringe pump, a peristaltic pump, a diaphragm pump, etc. While the pump 134 as shown may be positioned between the flow cell 130 and the waste reservoir 110, in other examples, the pump 134 may be positioned upstream of the flow cell 130, downstream of the waste reservoir 110, or omitted entirely.

Referring now to the drive assembly 104, in the example shown, the drive assembly 104 includes a pump drive assembly 138 and a valve drive assembly 140. The pump drive assembly 138 is adapted to interface with the pump 134 to pump fluid through the reagent cartridge 126. The valve drive assembly 140 is adapted to interface with the valve 121 to control the position of the valve 121. In an example, the valve 121 is implemented by a rotary valve having a first position that blocks flow to the flow cell 130 and a second position that allows flow from one or more of the reagent reservoirs 126 to the flow cell 130. However, the valve 121 may be positioned in any number of positions to flow any one or more of a first reagent, a buffer reagent, a second reagent, etc. to the flow cell 130.

Referring to the controller 106, in the example shown, the controller 106 includes a user interface 142, a communication interface 144, one or more processors 146, and a memory 148 storing instructions executable by the one or more processors 146 to perform various functions including the disclosed examples. The user interface 142, the communication interface 144, and the memory 148 are electrically and/or communicatively coupled to the one or more processors 146.

In an example, the user interface 142 is adapted to receive input from a user and to provide information to the user associated with the operation of the system 100 and/or an analysis taking place. The user interface 142 may include a touch screen, a display, a keyboard, a speaker(s), a mouse, a track ball, and/or a voice recognition system. The touch screen and/or the display may display a graphical user interface (GUI).

In an example, the communication interface 144 is adapted to enable communication between the system 100 and a remote system(s) (e.g., computers) via a network(s). The network(s) may include the Internet, an intranet, a local-area network (LAN), a wide-area network (WAN), a coaxial-cable network, a wireless network, a wired network, a satellite network, a digital subscriber line (DSL) network, a cellular network, a Bluetooth connection, a near field communication (NFC) connection, etc. Some of the communications provided to the remote system may be associated with analysis results, imaging data, etc. generated or otherwise obtained by the system 100. Some of the communications provided to the system 100 may be associated with a fluidics analysis operation, patient records, and/or a protocol(s) to be executed by the system 100.

The one or more processors 146 and/or the system 100 may include one or more of a processor-based system(s) or a microprocessor-based system(s). In some examples, the one or more processors 146 and/or the system 100 includes one or more of a programmable processor, a programmable controller, a microprocessor, a microcontroller, a graphics processing unit (GPU), a digital signal processor (DSP), a reduced-instruction set computer (RISC), an application specific integrated circuit (ASIC), a field programmable gate array (FPGA), a field programmable logic device (FPLD), a logic circuit, and/or another logic-based device executing various functions including the ones described herein.

The memory 148 can include one or more of a semiconductor memory, a magnetically readable memory, an optical memory, a hard disk drive (HDD), an optical storage drive, a solid-state storage device, a solid-state drive (SSD), a flash memory, a read-only memory (ROM), erasable programmable read-only memory (EPROM), electrically erasable programmable read-only memory (EEPROM), a random-access memory (RAM), a non-volatile RAM (NVRAM) memory, a compact disc (CD), a compact disc read-only memory (CD-ROM), a digital versatile disk (DVD), a Blu-ray disk, a redundant array of independent disks (RAID) system, a cache, and/or any other storage device or storage disk in which information is stored for any duration (e.g., permanently, temporarily, for extended periods of time, for buffering, for caching).

FIG. 2 is a cross-sectional top view of an example of an enclosure 102 of the system 100 of FIG. 1. In the example shown, the enclosure 102 includes an example of the magnetic panel joint 118 formed by the first panel 114 carrying a magnet 149 and including a first pocket 150. The magnet panel joint 118 is also formed by the second panel 116 having a second pocket 151 including adhesive 152. The first pocket 150 and the second pocket 151 can be beneficial by providing a recessed space for a connecting component or shield. In some implementations, another coupling component, such as another magnet, recessed screws or bolts, a weld, etc. can be used instead of or in addition to the adhesive 152. The adhesive 152 or other coupling component can be beneficial by securing the connecting component or shield within the second pocket 151. The adhesive 152 may be an electromagnetic compatible (EMC) tape or another type of tape such as, for example, double-sided tape, adhesive-transfer tape, single-sided over the top tape, etc. Other adhesives or couplings may prove suitable. The first and/or second pockets 150, 151 may be referred to as lap pockets or shield pockets.

The magnetic panel joint 118 also includes a ferromagnetic shield 153 coupled within the second pocket 150 via the adhesive 152. The shield 153 is configured to be coupled within the first pocket 150 via the magnet 149. The magnetic coupling can be beneficial by providing a selectively attachable and/or detachable interface between the shield 153 of the second panel 116 and the magnet 149 of the first panel 114. The shield 153 may be referred to as a ferromagnetic lap or a ferrous shielding plate. In examples in which the panels 114, 116 are metal, the shield 153 may provide a path to ground and may deter against radiative emission. The panels 114, 116 may have a thickness of approximately 5 millimeters. However, the panels 114, 116 may have any other thickness.

The shield 153 may include a material that is conductive (e.g., electrically coupled) to the panels 114, 116. As an example, the panels 114, 116 may include a zinc or nickel plated steel or 400-series stainless steel or another corrosion resistant ferrous backing material. Other materials may prove suitable. In another example, the shield 153 may be integral to the second panel 116. In such an example, the second panel 116 may not include the second pocket 151 and the adhesive 152.

In the example shown, an inward facing ferromagnetic shield surface 154 is substantially flush with the inward facing second panel surface 120. Additionally, in the example shown, the inward facing first panel surface 119 is substantially flush with the inward facing shield surface 154 when the ferromagnetic shield 153 is coupled within the first pocket 150 via the magnet 149.

Figure 3:
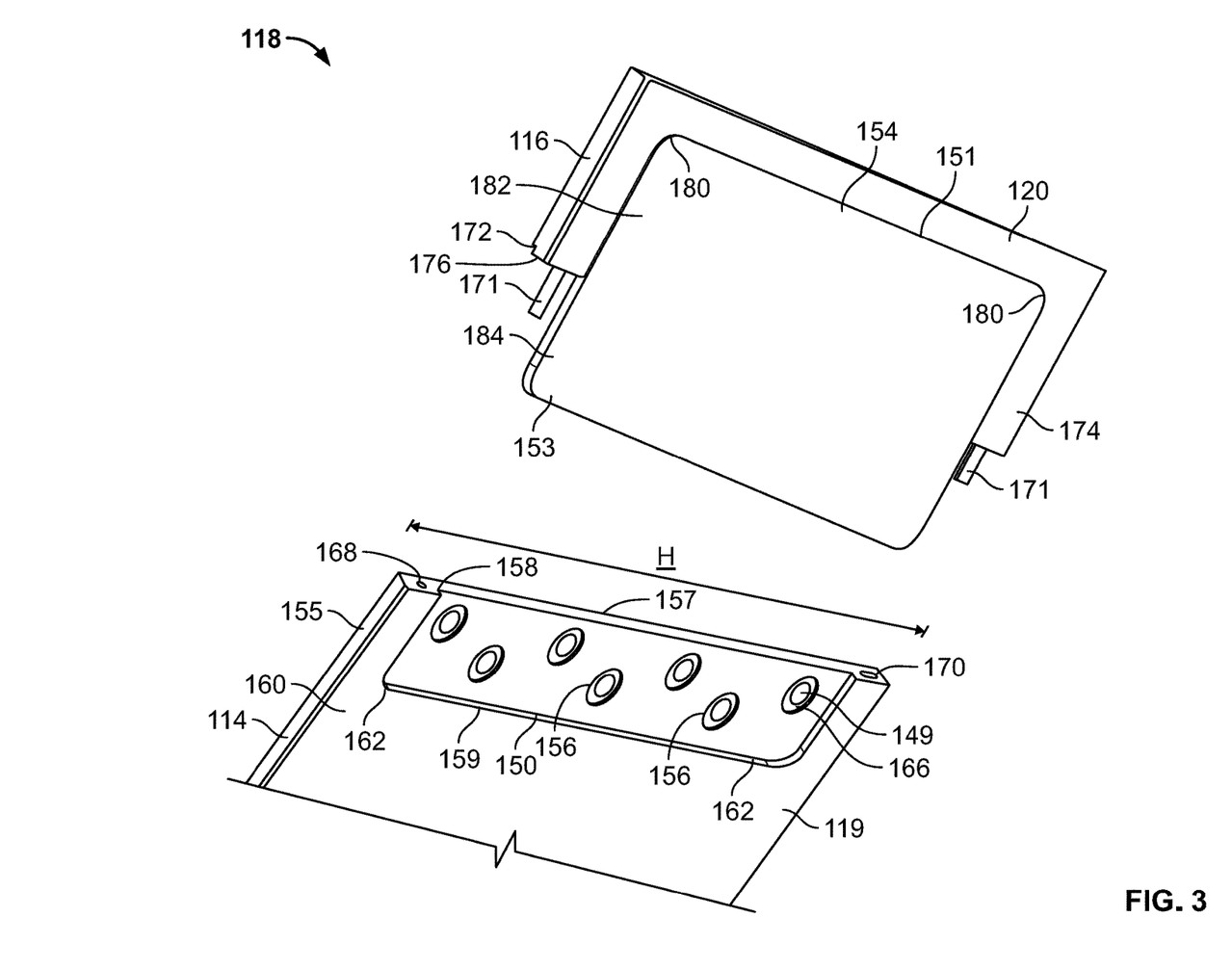
FIG. 3 illustrates a detailed expanded isometric view of another example of a magnetic panel joint of the system of FIG. 1 including a first panel, a second panel, and a ferromagnetic shield.

FIG. 3 illustrates a detailed expanded isometric view of another example of a magnetic panel joint 118 of the system 100 of FIG. 1 including the first panel 114, the second panel 116, and the shield 153. The first panel 114 includes an end portion 155 defining the pocket 150 and a plurality of the receptacles 156. The pocket 150 terminates at an end face 157 of the first panel 114. In the example shown, the pocket 150 is defined along a majority of the height H of the first panel 114. The pocket 150 may have alternative dimensions.

The receptacles 156 are positioned in a staggered arrangement. Alternative arrangements for the receptacles 156 may prove suitable (see, for example, FIG. 8). While seven receptacles 156 are included in the example shown, a different number of receptacles 156 may be included including one (see, for example, FIG. 9).

The pocket 150 includes an end opening 158 and is contiguous with the receptacles 156. The end opening 158 is defined by the end face 157 of the first panel 114. A lateral opening 159 of the pocket 150 is defined by an inner first panel surface 160 of the first panel 114. The pocket 150 has a rectangular cross-section and has rounded-back corners 162. The rounded back-corners 162 may facilitate manufacturability using, for example, a milling machine.

A magnet 149 can be disposed within each of the receptacles 156. The magnets 149 may be disk shaped and may be rare-earth magnets. Other magnet types or removable couplings may prove suitable. The magnets 149 are coupled within the receptacles 156 via adhesive 166. The adhesive 166 may be a retaining compound (e.g., a thread-locking adhesive) or another adhesive that is adapted to cure in the absence of air. Other adhesive may prove suitable. In some other implementations, the magnets 149 may be press-fit into the receptacles 156.

In some implementations, the end face 157 of the first panel 114 also defines a master dowel bore 168 and a slave dowel bore 170 of a dowel joint. The master dowel bore 168 is defined on one side of the pocket 150 of the first panel 114 and the slave dowel bore 170 is defined on another side of the pocket 150. The master dowel bore 168 may have a circular cross-section and the slave dowel bore 170 may have an oblong cross-section. The slave dowel bore 170 is adapted to account for manufacturing tolerances. The dowel bores 168, 170 are each adapted to receive one of a pair of alignment dowels 171 that together form the dowel joint. Receipt of the alignment dowels 171 within the dowel bores 168, 170 may be beneficial to provide alignment between the panels 114, 116 in a direction generally orthogonal to the magnetic panel joint 118. In other examples, the alignment dowels 171 and the corresponding dowel bores 168, 170 may not be provided or only a single dowel bore 168, 170 and a single alignment dowel 171 may be provided.

The second panel 116 includes an end portion 174 having an end face 176 and defining the second pocket 151. The alignment dowels 171 extend from the second panel 116 on either side of the second pocket 151. The second pocket 151 terminates at the end face 176 of the second panel 116. The pockets 150 and/or 151 may be masked from plating in examples in which the panels 114 and/or 116 are plated and/or the pockets 150 and/or 150 may be plated with a conductive material to provide an electrical coupling with the shield 153 on both sides of the magnetic panel joint 118.

In the example shown, the second pocket 151 is defined along a majority of the height H of the second panel 116. The second pocket 151 may have alternative dimensions. The second pocket 151 includes a pair of rounded-back corners 180. In the example shown, the first pocket 150 is similar to the second pocket 151. The first and second pockets 150, 151 may be mirror images or otherwise similar to one another. Other dimensions for the pockets 150, 151 may prove suitable.

In another example, to account for a thickness of adhesive used to adhere the shield 153 within the second pocket 151 and to the second panel 116, a depth of the first pocket 150 may be less than a depth of the second panel 116. The depth of the pockets 150 and/or 151 may be between about 0.5 millimeters (mm) and about 1.0 mm. Other approaches to account for the thickness of the adhesive 152 (the adhesive 152 is more clearly shown in FIG. 6) may prove suitable. For example, to account for a thickness of the adhesive, the shield 153 may include a first shield portion 182 having a first thickness and a second shield portion 184 having a second thickness greater than the first thickness. The first shield portion 182 may be referred to as a first lap portion and the second shield portion 184 may be referred to as a second lap portion. Alternatively, the thickness of the adhesive 152 may be ignored as negligibly affecting the flushness of the adjacent surfaces, for example.

In the example shown, the first shield portion 182 is disposed within the second pocket 151 of the second panel 116 and the second shield portion 184 extends from the end face 176 of the second panel 116. When the first shield portion 182 is disposed within the second pocket 151, the resulting combined thickness of the first shield portion 182 within the second pocket 151 of the second panel 116 may be substantially the same as the thickness of the second panel 151 (prior to second pocket 151 being formed) and/or may be substantially the same. As set forth herein, the phrase "substantially" means that the panels are within +/−5% of measurement, including equal to the measurement.

In the example shown, the adhesive 152 is used to couple the first shield portion 182 within the second pocket 151. The inward facing shield surface 154 of the shield 153 is substantially flush with the inward facing second panel surface 120. Similarly, the inward facing shield surface 154 and the inward facing second panel surface 120 are substantially flush with the inward facing first panel surface 119 of the first panel 114 (see, for example, FIG. 7) when coupled to the first panel 114 as described herein.

To couple the first and second panels 114, 116 together, the panels 114, 116 are slid together in-plane until the alignment dowels 171 enter the dowel bores 168, 170 and the second shield portion 184 is fully received within the pocket 150 of the first panel 114. The interaction between the alignment dowels 171 and the dowel bores 168, 170 may substantially ensure proper and repeatable alignment between the first and second panels 114, 116. Extending the shield 153 between the first and second panels 114, 116 may deter ingress and egress of light between the panels 114, 116. In examples in which the alignment dowels 171 and the dowel bores 168, 170 are not provided, the interaction between the second shield portion 184 and the first pocket 150 substantially ensures proper and repeatable alignment between the first and second panels 114, 116. The magnets 149 of the first panel 114 attract the ferromagnetic shield 153 to further couple the shield 153 to the first panel 114.

In some implementations, an outer edge 172 of the second panel 116 can be formed to include a step, though this is merely optional and may be omitted. The step formed at the outer edge 172 may visually reduce the appearance of any discontinuities due to manufacturing tolerances by visually providing a simulated seam when the first panel 114 is coupled to the second panel 116. In other implementations, the step may be omitted such that the first panel 114 and the second panel 116 can be coupled together to form a substantially seamless exterior appearance on the side opposite the shield 153.

To uncouple the first and second panels 114, 116, the second panel 116 is moved away from the first panel 114 such that the alignment dowels 171 are removed from the dowel bores 168, 170 and the second shield portion 184 is slid along the magnets 149 until the first and second panels 114, 116 are separated from each other. Thus, the panels 114, 116 may be coupled and uncoupled without the use of tools.

FIGS. 4-7 depict an example process of forming the magnetic panel joint 118 of FIG. 1.

Figure 4:
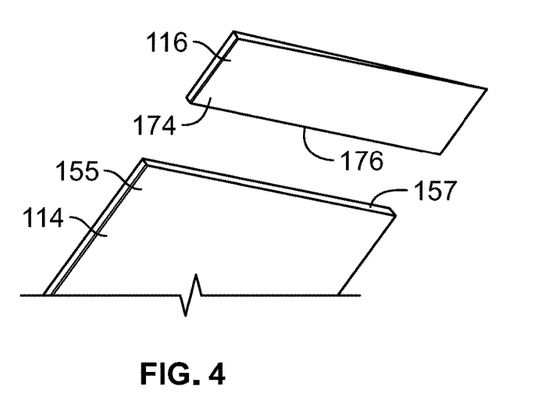
FIG. 4 is an isometric view of the first panel and the second panel of FIG. 3 prior to pockets being formed therein.

FIG. 4 is an isometric view of the first panel 114 and the second panel 116 prior to the pockets 150, 151 being formed and including the end portions 155, 174 and the end faces 157, 176.

Figure 5:
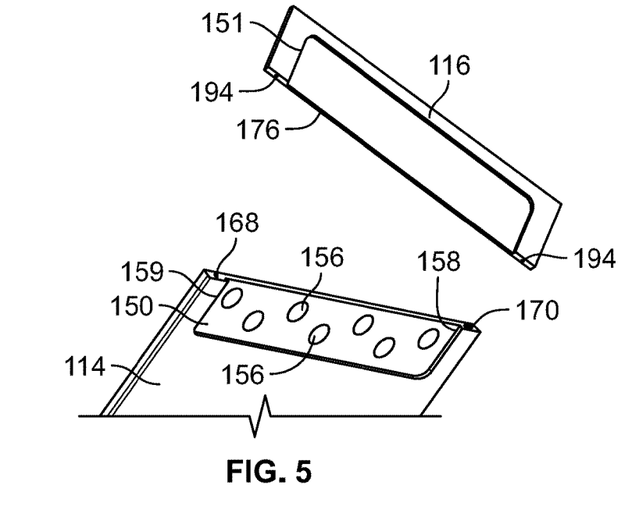
FIG. 5 is an isometric view of the first panel of FIG. 3 after a first pocket, receptacles, and dowel bores are formed in the first panel and of the second panel of FIG. 3 after the second pocket and corresponding dowel bores are formed in the second panel.

FIG. 5 is an isometric view of the first panel 114 after the first pocket 150, the receptacles 156, and the dowel bores 168, 170 are formed in the first panel 114. FIG. 5 also shows an isometric view of the second panel 116 after the second pocket 151 and corresponding dowel bores 194 are formed. The dowel bores 194 are blind holes and may be sized to form an interference fit with the alignment dowels 171. Other methods to form a coupling between the dowel bores 194 and the alignment dowels 171 may prove suitable, such as using an adhesive, forming threads to screw in the dowels, etc.

Figure 6:
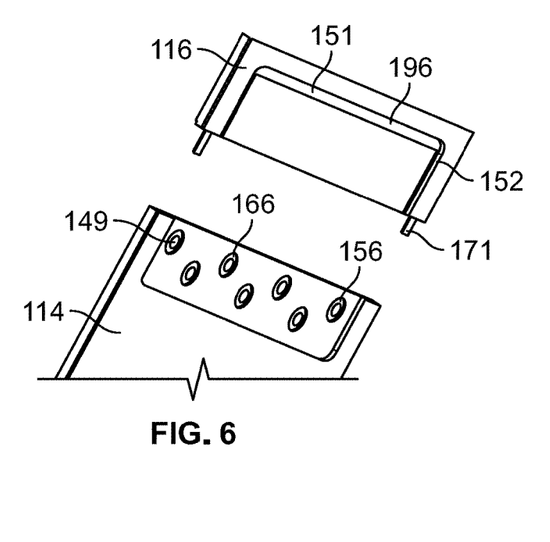
FIG. 6 is an isometric view of the first panel of FIG. 3 after magnets are coupled within the receptacles of the first panel via adhesive and of the second panel of FIG. 3 after the adhesive is applied to a surface forming the second pocket of FIG. 3 and the alignment dowels are coupled within the dowel bores of the second panel.

FIG. 6 is an isometric view of the first panel 114 after the magnets 149 are coupled within the receptacles 156 via the adhesive 166. FIG. 6 also shows an isometric view of the second panel 116 after the adhesive 152 is applied to a surface 196 forming the second pocket 151 and after the alignment dowels 171 are coupled within the dowel bores 194. The shield 153 can be attached to the adhesive 166 to form the assembly shown in FIG. 3.

Figure 7:
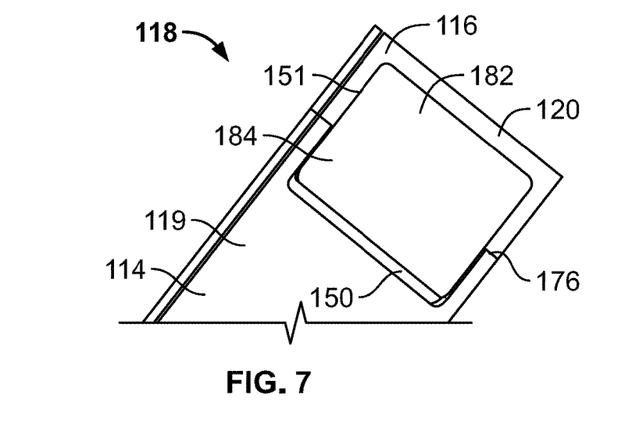
FIG. 7 is an isometric view of the interior of the magnetic panel joint of FIG. 3 formed between the first panel and the second panel when the panels are coupled together including the ferromagnetic shield coupled to the adhesive of the second panel and attracted to the magnets of the first panel.

FIG. 7 is an isometric view of the interior of the magnetic panel joint 118 formed between the first panel 114 and the second panel 116 when coupled together. The first shield portion 182 is coupled within the second pocket 151 via the adhesive 152 and the second shield portion 184 extends from the end face 176 of the second panel 116. The second shield portion 184 is disposed within the first pocket 150 of the first panel 114 and coupled therein via the attraction between the shield 153 and the magnets 149. The attraction between the shield 153 and the magnets 149 cause the first and second panels 114, 116 to be pulled into plane with one another.

Figure 8:
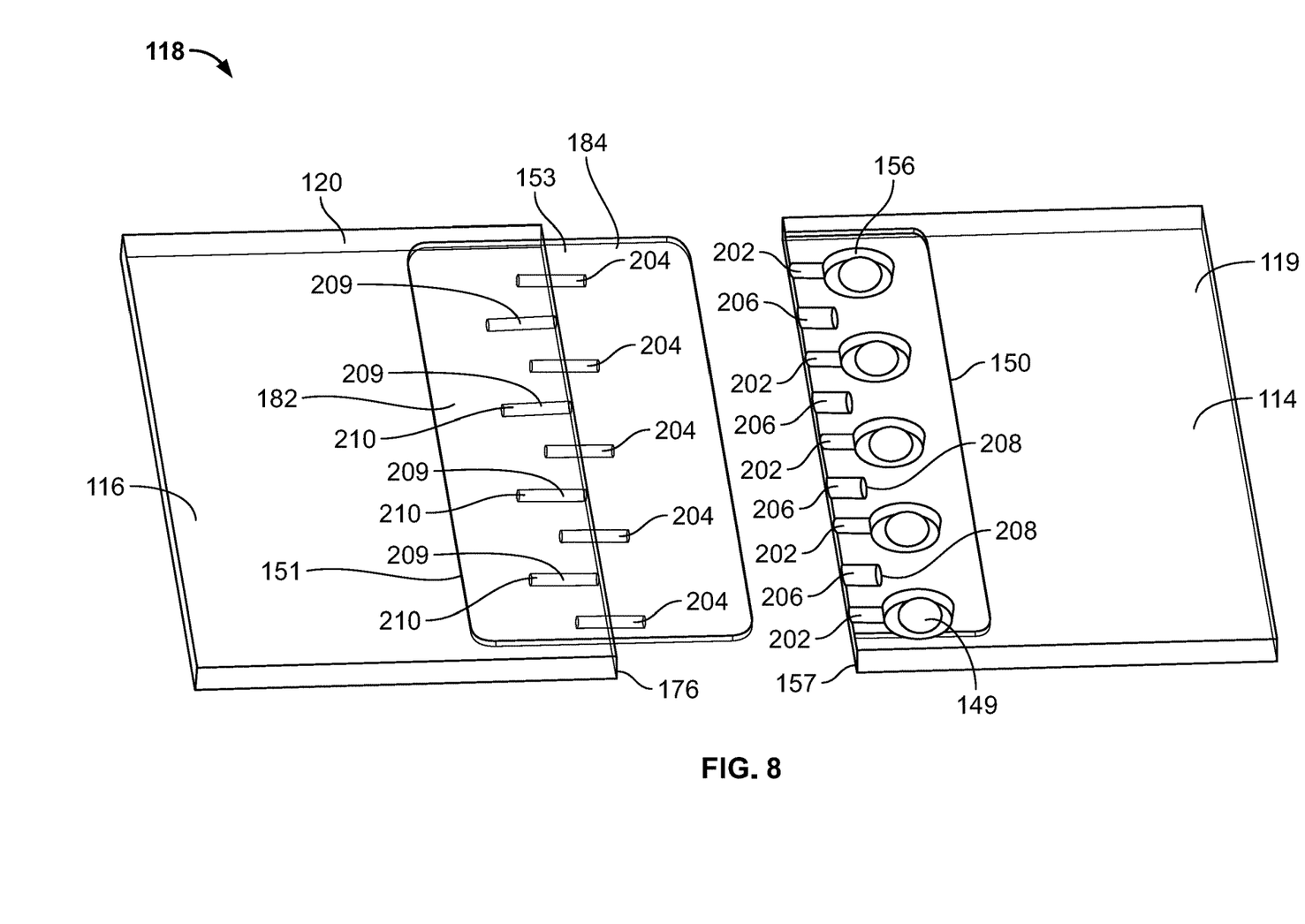
FIG. 8 illustrates a detailed expanded isometric view of another example of a magnetic panel joint of the system of FIG. 1 including a first panel, a second panel, and a ferromagnetic shield.

FIG. 8 illustrates a detailed expanded isometric view of another example of a magnetic panel joint 118 of the system 100 of FIG. 1 including the first panel 114, the second panel 116, and the shield 153. The magnetic panel joint 118 of FIG. 8 is similar to the magnetic panel joint 118 of FIG. 3. In contrast, the magnet panel joint 118 of FIG. 8 includes receptacles 156 that are not staggered and includes a plurality of alignment bores 202. Each of the alignment bores 202 is coupled to and, thus, contiguous and/or coplanar with one of the receptacles 156. The second panel 116 includes a plurality of alignment dowels 204 that correspond to the alignment bores 202. The alignment dowels 204 may be made of a ferromagnetic material. As a result, when the alignment dowels 204 are received within the alignment bores 202, a magnetic coupling is formed between the alignment dowels 204 and the corresponding magnet 149 that may create a nesting force that draws the panels 114, 116 together. The magnetic coupling of the alignment dowels 204 to the corresponding magnets 149 may be beneficial to provide planar coupling between the first panel 114 and the second panel 116, planar alignment between the first panel 114 and the second panel 116, and/or retention force between the first panel 114 and the second panel 116. In another example, the alignment dowels 214 may not be made of the ferromagnetic material.

The magnetic panel joint 118 of FIG. 8 may also include a plurality of face magnets 206 carried by the first panel 114. The face magnets 206 may be coupled within blind bores 208 at the end face 157 of the first panel 114. The face magnets 206 may be small magnets and/or ferrous striker plates. The face magnets 206 may be coupled to the first panel 114 via adhesive. Other methods of coupling the face magnets 206 may prove suitable.

The second panel 116 may carry a plurality of corresponding face ferromagnetic segments 209. As a result, when the panels 114, 116 abut one another, a magnetic coupling is formed between the face magnets 206 and the face ferromagnetic segments 209. The magnetic coupling between face magnets 206 and the face ferromagnetic segments 209 may assist in coupling the panels 114, 116 together and may create a nesting force that draws the panels 114, 116 together. That is, the face magnets 206 and ferromagnetic segments 209 and/or other magnets may be beneficial to provide planar coupling between the first panel 114 and the second panel 116, planar alignment between the first panel 114 and the second panel 116, and/or retention force between the first panel 114 and the second panel 116.

The face ferromagnetic segments 209 may be coupled within face bores 210 of the second panel 216 via, for example, adhesive. In the example shown, the face magnets 206 are substantially flush with the end face 157 of the first panel 114 and the face ferromagnetic segments 209 are substantially flush with the end face 176 of the second panel 116. In some examples, the magnetic coupling between the face magnets 206 and the face ferromagnetic segments 209 may be sufficient to form the coupling between the first and second panels 114, 116. As a result, in some examples, the shield 153 may be made of a non-ferromagnetic material. Regardless of the type of material that the shield 153 is formed of, the shield 153 may be provided as a light shield and/or as a conductive shield for emissions.

Figure 9:
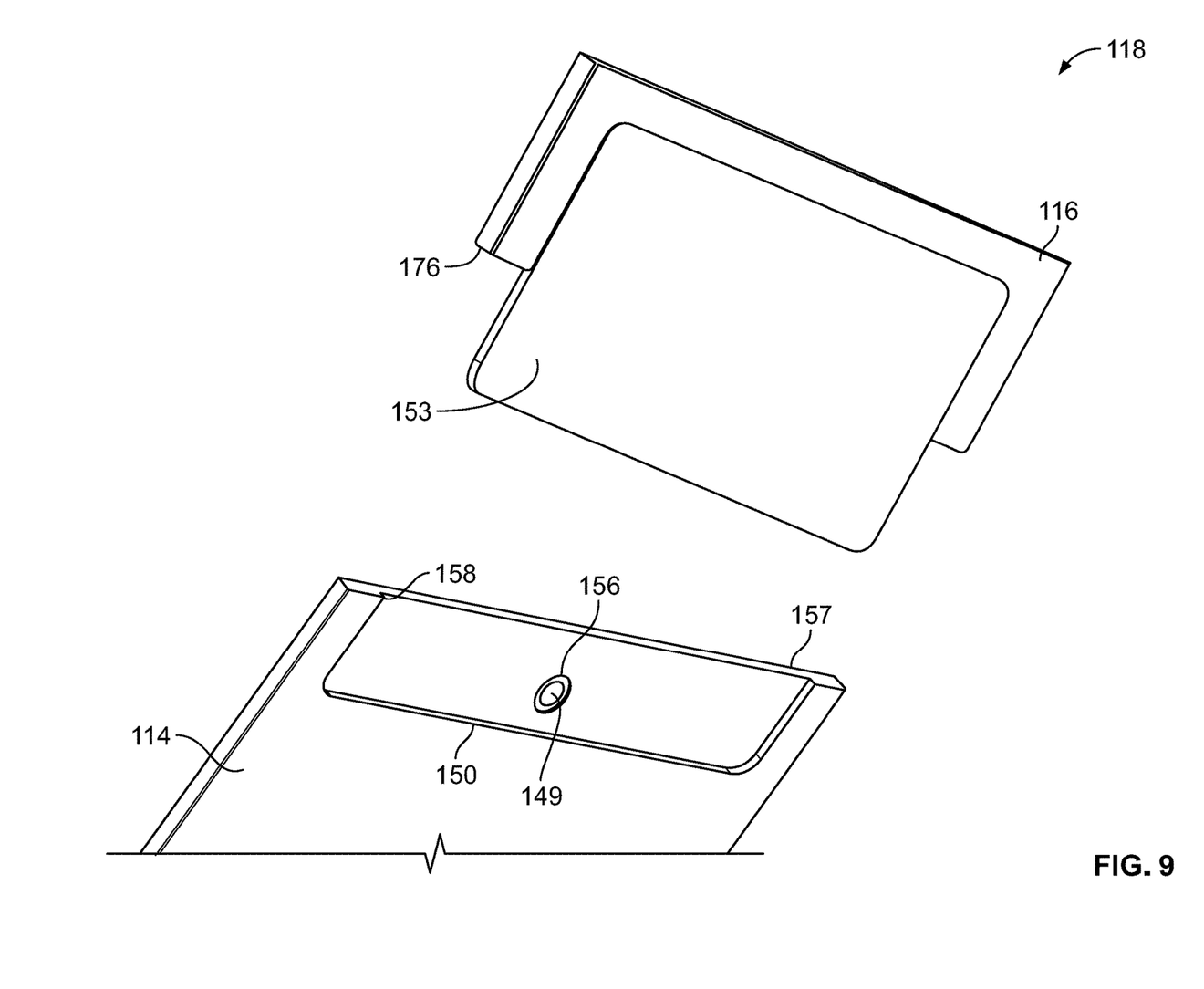
FIG. 9 illustrates a detailed expanded isometric view of yet another example of a magnetic panel joint of the system of FIG. 1 including a first panel, a second panel, and a ferromagnetic shield, where the first panel carries magnets and the second panel includes ferrous alignment dowels that are attracted to the magnets of the first panel.

FIG. 9 illustrates a detailed expanded isometric view of yet another example of a magnetic panel joint 118 of the system 100 of FIG. 1 including the first panel 114, the second panel 116, and the shield 153. The magnetic panel joint 118 of FIG. 9 is similar to the magnetic panel joint 118 of FIG. 3. In contrast, the magnet panel joint 118 of FIG. 9 includes a single receptacle 156 carrying a single magnet 149 and does not include the alignment dowels 171 and corresponding dowel bores 168, 170.

Figure 10:
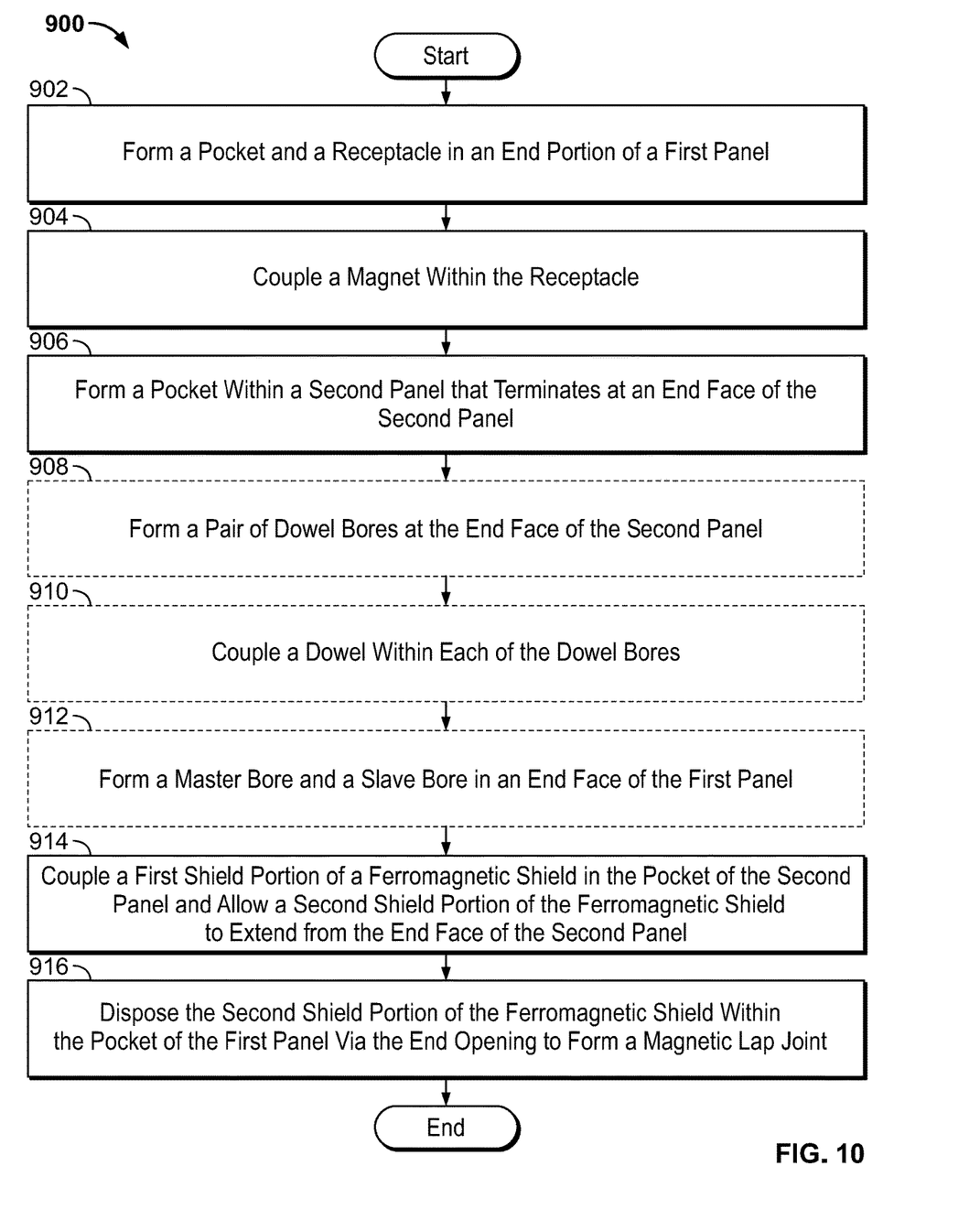
FIG. 10 illustrates a flowchart for a method of forming an example of a magnetic panel joint of the system of FIG. 1.
Figure 11:
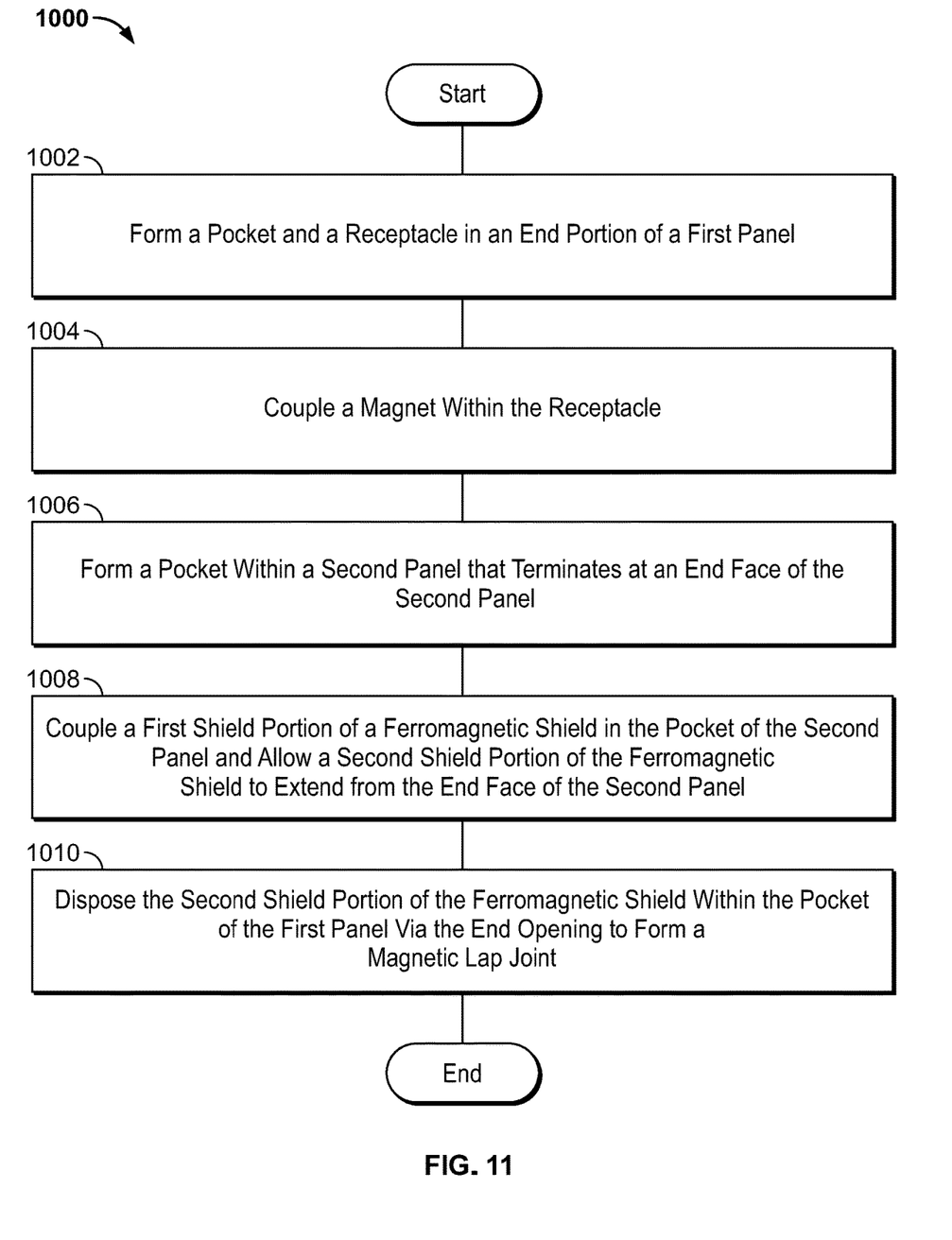
FIG. 11 illustrates a flowchart for a method of forming another example of a magnetic panel joint of the system of FIG. 1.

FIGS. 10 and 11 illustrate a flowchart for a method of forming an example of a magnetic panel joint 118 of the system 100 of FIG. 1. In the flow chart of FIG. 10, the blocks surrounded by solid lines may be included in an example process 900 while the blocks surrounded in dashed lines may be optional in the example process. However, regardless of the way the border of the blocks is presented in FIGS. 10 and 11, the order of execution of the blocks may be changed, and/or some of the blocks described may be changed, eliminated, combined and/or subdivided into multiple blocks.

The process 900 of FIG. 10 begins at block 902 by forming the first pocket 150 and the receptacle 156 in the end portion 155 of the first panel 114. The first pocket 150 includes the end opening 158 and is contiguous with the receptacle 156. The magnet 149 is coupled within the receptacle 156 via the adhesive 166 (block 904) or any other suitable coupling for the magnet 149 within the receptacle, such as an interference fit. In some examples, forming the receptacle 156 includes forming a plurality of receptacles 156 in the end portion 155 of the first panel 114 and coupling the magnet 149 within the receptacle 156 via the adhesive 166 includes coupling a magnet 149 in each of the plurality of receptacles 156 via the adhesive 166.

The second pocket 151 is formed within the second panel 116 that terminates at the end face 176 of the second panel 116 (block 906). The pair of dowel bores 194 are formed at the end face 176 of the second panel 116 (block 908), though in some implementations, the dowel bores 194 may be omitted. One of the alignment dowels 171 is coupled within each of the dowel bores 194 (block 910). The alignment dowels 171 may be coupled within the dowel bores 194 via an interference fit or adhesive, for example. The master dowel bore 168 and the slave dowel bore 170 are formed in the end face 157 of the first panel 114 (block 912), though in some implementations, the master dowel bore 168, slave dowel bore 170, and/or both may be omitted. The master dowel bore 168 and the slave dowel bore 170 are adapted to receive one of the alignment dowels 171.

The first shield portion 182 of the shield 153 is coupled within the second pocket 151 via the adhesive 152 in a manner that allows the second shield portion 184 to extend from the end face 176 of the second panel 116 (block 914). When the first shield portion 182 is coupled within the second pocket 151, the inward facing shield surface 154 can be substantially flush with the inward facing second panel surface 120.

The second shield portion 184 is disposed within the first pocket 150 of the first panel 114 via the end opening 158 to form the magnetic lap joint 118 (block 916). The inward facing shield surface 154 and the inward facing second panel surface 120 can be substantially flush with the inner first panel surface 160 of the first panel 114.

FIG. 11 illustrates a flowchart for a method of forming another example of a magnetic panel joint 118 of the system 100 of FIG. 1. A process 1000 of FIG. 11 begins at block 1002 by forming the first pocket 150 and the receptacle 156 in the end portion 155 of the first panel 114. The first pocket 150 includes the end opening 158 and is contiguous with the receptacle 156. The magnet 149 is coupled within the receptacle 156 via the adhesive 166 (block 1004).

The second pocket 151 is formed within the second panel 116 that terminates at the end face 176 of the second panel 116 (block 1006). The first shield portion 182 of the shield 153 is coupled within the second pocket 151 via the adhesive 152 in a manner that allows the second shield portion 184 to extend from the end face 176 of the second panel 116 (block 1008). When the first shield portion 182 is coupled within the second pocket 151, the inward facing shield surface 154 is substantially flush with the inward facing second panel surface 120.

The second shield portion 184 is disposed within the first pocket 150 of the first panel 114 via the end opening 158 to form the magnetic lap joint 118 (block 1010). The inward facing shield surface 154 and the inward facing second panel surface 120 are substantially flush with the inner first panel surface 160 of the first panel 114.

A method, comprising: forming a pocket and a receptacle in an end portion of a first panel, the pocket having an end opening and being contiguous with the receptacle; coupling a magnet within the receptacle; forming a pocket within a second panel that terminates at an end face of the second panel; coupling a first shield portion of a ferromagnetic shield in the pocket of the second panel such that a second shield portion of the ferromagnetic shield extends from the end face of the second panel, an inner shield surface of the ferromagnetic shield being substantially flush with an inner second panel surface of the second panel; and disposing the second shield portion of the ferromagnetic shield within the pocket of the first panel via the end opening to form a magnetic lap joint, wherein the inner shield surface and the inner second panel surface are substantially flush with an inner first panel surface of the first panel.

The method of any one or more of the preceding examples and/or any one or more of the examples disclosed below, wherein forming the receptacle comprises forming a plurality of receptacles in the end portion of the first panel and wherein coupling the magnet within the receptacle comprises coupling a magnet in each of the plurality of receptacles.

The method of any one or more of the preceding examples and/or any one or more of the examples disclosed below, further comprising forming a pair of dowel bores at the end face of the second panel, coupling a dowel within each of the dowel bores, and forming a master dowel bore and a slave dowel bore in an end face of the first panel, the master dowel bore and the slave dowel bore being adapted to each receive a respective one of the dowels.

An apparatus, comprising: a first panel having an end portion defining a pocket and a receptacle, the pocket having an end opening and being contiguous with the receptacle; a magnet disposed within the receptacle and coupled therein; a second panel having an end portion including an end face and defining a pocket terminating at the end face; and a ferromagnetic shield having a first shield portion and a second shield portion, the first shield portion disposed within the pocket of the second panel and coupled therein, the second shield portion extending from the end face of the second panel, an inner shield surface of the ferromagnetic shield being substantially flush with an inner second panel surface of the second panel, wherein the second shield portion of the ferromagnetic shield is receivable within the pocket of the first panel via the end opening to form a magnetic lap joint, wherein the inner shield surface and the inner second panel surface are substantially flush with an inner first panel surface of the first panel.

The apparatus of any one or more of the preceding examples and/or any one or more of the examples disclosed below, further comprising a dowel joint formed between the first panel and the second panel when the magnetic lap joint is formed between the first panel and the second panel.

The apparatus of any one or more of the preceding examples and/or any one or more of the examples disclosed below, wherein the dowel joint comprises a pair of dowels, a master dowel bore, and a slave dowel bore.

The apparatus of any one or more of the preceding examples and/or any one or more of the examples disclosed below, wherein the dowels extend from the second panel on either side of the pocket of the second panel, the master dowel bore being defined on one side of the pocket of the first panel, the slave dowel bore being defined on another side of the pocket of the first panel.

The apparatus of any one or more of the preceding examples and/or any one or more of the examples disclosed below, wherein the first panel defines a plurality of receptacles including the receptacle, wherein each of the plurality of receptacles includes a corresponding magnet disposed therein.

The apparatus of any one or more of the preceding examples and/or any one or more of the examples disclosed below, wherein the receptacles are positioned in a staggered arrangement.

The apparatus of any one or more of the preceding examples and/or any one or more of the examples disclosed below, wherein the pocket of the first panel and the pocket of the second panel are similar to one another.

An apparatus, comprising: an enclosure, the enclosure comprising a magnetic panel joint formed by: a first panel carrying a magnet and comprising a first pocket; a second panel comprising a second pocket; and a ferromagnetic shield coupled within the second pocket and couplable within the first pocket via the magnet.

The apparatus of any one or more of the preceding examples and/or any one or more of the examples disclosed below, wherein the enclosure substantially restricts ingress and egress of light from the enclosure.

The apparatus of any one or more of the preceding examples and/or any one or more of the examples disclosed below, wherein the magnetic panel joint substantially restricts ingress and egress of light through the magnetic panel joint.

The apparatus of any one or more of the preceding examples and/or any one or more of the examples disclosed below, wherein an inward facing ferromagnetic shield surface of the ferromagnetic shield is substantially flush with an inward facing second panel surface of the second panel.

The apparatus of any one or more of the preceding examples and/or any one or more of the examples disclosed below, wherein an inward facing first panel surface is substantially flush with the inward facing ferromagnetic shield surface when the ferromagnetic shield is coupled within the first pocket via the magnet.

The apparatus of any one or more of the preceding examples and/or any one or more of the examples disclosed below, further comprising an alignment dowel bore defined by one of the first panel or the second panel and a corresponding alignment dowel carried by the other one of the first panel or the second panel.

The apparatus of any one or more of the preceding examples and/or any one or more of the examples disclosed below, wherein the first panel defines a receptacle receiving the magnet, the alignment dowel bore is defined by the first panel and is coplanar with the receptacle, and the alignment dowel includes a ferromagnetic material.

The apparatus of any one or more of the preceding examples and/or any one or more of the examples disclosed below, wherein the alignment dowel bore comprises a master dowel bore, further comprising a slave dowel bore defined by the first panel or the second panel and a corresponding alignment dowel carried by the other of the first panel or the second panel.

The apparatus of any one or more of the preceding examples and/or any one or more of the examples disclosed below, wherein the first panel and the second panel comprise end faces, one of the end faces carries a face magnet and the other one of the end faces carries a corresponding face ferromagnetic segment.

The apparatus of any one or more of the preceding examples and/or any one or more of the examples disclosed below, wherein exterior surfaces of the first panel and the second panel are substantially flush or otherwise visually contiguous.

The foregoing description is provided to enable a person skilled in the art to practice the various configurations described herein. While the subject technology has been particularly described with reference to the various figures and configurations, it should be understood that these are for illustration purposes only and should not be taken as limiting the scope of the subject technology.

As used herein, an element or step recited in the singular and proceeded with the word "a" or "an" should be understood as not excluding plural of said elements or steps, unless such exclusion is explicitly stated. Furthermore, references to "one implementation" are not intended to be interpreted as excluding the existence of additional implementations that also incorporate the recited features. Moreover, unless explicitly stated to the contrary, implementations "comprising," "including," or "having" an element or a plurality of elements having a particular property may include additional elements whether or not they have that property. Moreover, the terms "comprising," including," having," or the like are interchangeably used herein.

The terms "substantially," "approximately," and "about" used throughout this Specification are used to describe and account for small fluctuations, such as due to variations in processing. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

There may be many other ways to implement the subject technology. Various functions and elements described herein may be partitioned differently from those shown without departing from the scope of the subject technology. Various modifications to these implementations may be readily apparent to those skilled in the art, and generic principles defined herein may be applied to other implementations. Thus, many changes and modifications may be made to the subject technology, by one having ordinary skill in the art, without departing from the scope of the subject technology. For instance, different numbers of a given module or unit may be employed, a different type or types of a given module or unit may be employed, a given module or unit may be added, or a given module or unit may be omitted.

Underlined and/or italicized headings and subheadings are used for convenience only, do not limit the subject technology, and are not referred to in connection with the interpretation of the description of the subject technology. All structural and functional equivalents to the elements of the various implementations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

What is claimed is:

1. An apparatus, comprising:
   an enclosure, comprising:
      a first panel comprising a first end portion including a first end face;
      a magnet carried by the first end portion;
      a ferromagnetic shield; and
      a second panel comprising a second end portion carrying the ferromagnetic shield and including a second end face from which the ferromagnetic shield extends,
      wherein the first end face abuts the second end face and the ferromagnetic shield overlaps the first end portion and forms a magnetic coupling with the magnet,
   wherein the first end portion defines a pocket and a receptacle, the ferromagnetic shield being received within the pocket of the first end portion and the magnet being received within the receptacle, and
   wherein the second end portion defines a pocket and the ferromagnetic shield is coupled within the pocket.

2. The apparatus of claim 1, wherein an inner shield surface of the ferromagnetic material is substantially flush with inner panel surfaces of the first panel and the second panel.

3. The apparatus of claim 1, further comprising adhesive coupling the ferromagnetic shield within the pocket.

4. The apparatus of claim 1, wherein a surface defining the pocket of the first end portion and a surface defining the pocket of the second end portion are not plated.

5. The apparatus of claim 1, further comprising a conductive plating on a surface defining the pocket of the first end portion and a conductive plating on a surface defining the pocket of the second end portion.

6. The apparatus of claim 5, wherein an interaction between the conductive plating of the first end portion, the conductive plating of the second end portion, and the ferromagnetic shield form an electrical coupling.

7. The apparatus of claim 1, wherein a depth of the pocket of the first end portion is greater than a depth of the second end portion.

8. The apparatus of claim 1, wherein the first end portion defines a plurality of alignment bores and the second end portion includes a plurality of alignment dowels that are receivable within the corresponding alignment bores.

9. The apparatus of claim 8, wherein the first end portion defines a plurality of receptacles that each receive a corresponding magnet and wherein each of the alignment bores is coupled to one of the receptacles.

10. The apparatus of claim 9, wherein the alignment dowels include ferromagnetic material.

11. The apparatus of claim 1, wherein an outer edge of the first end portion or the second end portion defines a step.

12. The apparatus of claim 1, wherein the first end portion defines a plurality of receptacles that each receive a corresponding magnet.

13. The apparatus of claim 12, wherein the receptacles are staggered.

14. The apparatus of claim 12, wherein the receptacles are not staggered.

15. The apparatus of claim 1, wherein one of the first end face or the second end face carries a face magnet and the other one of the first end face or the second end face carries a corresponding face ferromagnetic segment.

16. The apparatus of claim 1, wherein exterior surfaces of the first panel and the second panel are substantially flush or otherwise visually contiguous.

17. An apparatus, comprising:
an enclosure, comprising:
a first panel comprising first end portions and corresponding first end faces;
a magnet carried by each of the first end portions;
a pair of ferromagnetic shields; and
a second panel comprising second end portions and corresponding second end faces, each second end portion carrying one of the ferromagnetic shields,
wherein the first end faces of the first panel abut the second end faces of the second panel and wherein the ferromagnetic shields span between the first end portions and the second end portions and form a magnetic coupling with the magnets,
wherein each of the first end portions defines a pocket and a receptacle, the ferromagnetic shields are received within the pocket of the first end portion and the magnet being received within the receptacle, and
wherein the second end portion defines a second pocket and the ferromagnetic shields are coupled within the second pocket.

18. The apparatus of claim 17, further comprising a pair of dowel joints formed between the first end portions and the second end portions.

19. The apparatus of claim 18, wherein each dowel joint comprises a pair of dowels and a pair of dowel bores.

20. The apparatus of claim 19, wherein the first end portions define the dowel bores and the dowels extend from the second end portions.

21. The apparatus of claim 19, wherein for each pair of dowel bores, one of the dowel bores has a circular cross-section and the other of the dowel bores has an oblong cross-section.

22. The apparatus of claim 17, wherein the first panel is a U-shaped panel and the second panel is a U-shaped panel.

23. An apparatus, comprising:
a system comprising an imaging system to obtain imaging data of one or more samples and an enclosure at least partially surrounding the imaging system, wherein the enclosure comprises:
a first panel comprising a first end portion including a first end face;
a magnet carried by the first end portion;
a ferromagnetic shield; and
a second panel comprising a second end portion carrying the ferromagnetic shield and including a second end face from which the ferromagnetic shield extends, wherein the first end face abuts the second end face and the ferromagnetic shield overlaps the first end portion and forms a magnetic coupling with the magnet,
wherein the first end portion defines a pocket and a receptacle, the ferromagnetic shield being received within the pocket of the first end portion and the magnet being received within the receptacle and wherein the second end portion defines a second pocket and the ferromagnetic shield is coupled within the second pocket.

* * * * *